(12) United States Patent
Wu et al.

(10) Patent No.: US 10,433,414 B2
(45) Date of Patent: Oct. 1, 2019

(54) MANUFACTURING METHOD OF PRINTING CIRCUIT BOARD WITH MICRO-RADIATORS

(71) Applicant: Rayben Technologies (HK) Limited, Hong Kong (CN)

(72) Inventors: Kai Chiu Wu, Hong Kong (CN); Lam Wai Kin Raymond, Hong Kong (CN); Zheng Wang, Zhuhai (CN)

(73) Assignee: Rayben Technologies (HK) Limited, Hong Kong (HK)

( * ) Notice: Subject to any disclaimer, the term of this patent is extended or adjusted under 35 U.S.C. 154(b) by 473 days.

(21) Appl. No.: 14/861,495

(22) Filed: Sep. 22, 2015

(65) Prior Publication Data

US 2016/0270227 A1 Sep. 15, 2016

Related U.S. Application Data

(63) Continuation-in-part of application No. 13/514,999, filed as application No. PCT/CN2011/070051 on Jan. 6, 2011, now Pat. No. 9,185,791.

(30) Foreign Application Priority Data

Dec. 24, 2010 (CN) .......................... 2010 1 0604353

(51) Int. Cl.
*H05K 1/11* (2006.01)
*H05K 3/06* (2006.01)
(Continued)

(52) U.S. Cl.
CPC ........... *H05K 1/0204* (2013.01); *H05K 1/036* (2013.01); *H05K 3/4691* (2013.01); *H05K 2201/10106* (2013.01)

(58) Field of Classification Search
CPC ..... H01L 33/20; H01L 33/641; H01L 33/642; H01L 2924/1517; H01L 2924/351;
(Continued)

(56) References Cited

U.S. PATENT DOCUMENTS 4,544,989 A * 10/1985 Nakabu .................. H05K 1/185
257/713
4,835,598 A * 5/1989 Higuchi ................ H01L 23/142
257/659

(Continued)

FOREIGN PATENT DOCUMENTS

CN 101790290 A 7/2010
CN 103069936 A 4/2013
(Continued)

OTHER PUBLICATIONS

Park Chan Ik et al., PCB Mounted a radiator and LED package using the PCB and method manufacturing them, 2005, Espacenet English translation. (Year: 2019).*

(Continued)

*Primary Examiner* — James Wu
*Assistant Examiner* — Michael A Matey
(74) *Attorney, Agent, or Firm* — Lerner, David, Littenberg, Krumholz & Mentlik, LLP

(57) ABSTRACT

A method of manufacturing a printed circuit board includes providing a substrate having at least one resin plate and a semi-cured sheet. A through hole is formed in the substrate to accommodate a radiator having an electrically conductive layer and an electrically insulated layer. The substrate and radiator are heat pressed to fully cure the epoxy and couple the substrate and radiator together. The excess resin is removed and electrically conductive layers are plated on the board. Surface circuits and a heat dissipating pattern are then etched into the conductive layer. An LED is attached to the (Continued)

printed circuit board. In some embodiments, a flexible segment is formed by removing a portion of the substrate. The radiator can have an electrically insulated layer extending at least partially across a surface of an electrically insulated and thermally conductive core.

14 Claims, 21 Drawing Sheets

(51) Int. Cl.
*H05K 1/14* (2006.01)
*H05K 3/32* (2006.01)
*H05K 1/02* (2006.01)
*H05K 3/46* (2006.01)
*H05K 3/40* (2006.01)
*H05K 1/03* (2006.01)

(58) Field of Classification Search
CPC ............ H01L 2924/14; H01L 21/4857; H01L 2224/73204; H01L 2225/06589; H05K 1/0204; H05K 1/036; H05K 3/4691; H05K 2201/10106; H05K 3/4069; H05K 1/185; H05K 3/4623; H05K 1/0203; H05K 1/0206; H05K 1/0298; H05K 1/0201

See application file for complete search history.

(56) References Cited

U.S. PATENT DOCUMENTS

| | | | | |
|---|---|---|---|---|
| 6,221,694 | B1* | 4/2001 | Bhatt | H01L 21/4803 257/E23.004 |
| 6,441,312 | B1* | 8/2002 | Tanimura | H05K 1/0206 174/252 |
| 6,642,612 | B2* | 11/2003 | Chen | H01L 21/4857 257/684 |
| 7,745,244 | B2 | 6/2010 | Yuan et al. | |
| 9,837,592 | B2* | 12/2017 | Ho | H01L 33/642 |
| 2002/0180062 | A1 | 12/2002 | Hsieh et al. | |
| 2005/0145414 | A1* | 7/2005 | Tohkairin | H05K 1/0207 174/252 |
| 2005/0263867 | A1* | 12/2005 | Kambe | H01L 23/49822 257/678 |
| 2006/0023432 | A1 | 2/2006 | Hockel et al. | |
| 2006/0180344 | A1* | 8/2006 | Ito | H01L 23/5385 174/262 |
| 2007/0201247 | A1* | 8/2007 | Ohno | G02B 6/0073 362/631 |
| 2008/0074830 | A1* | 3/2008 | Kurasawa | H05K 1/0281 361/807 |
| 2008/0179618 | A1 | 7/2008 | Cheng | |
| 2009/0039379 | A1* | 2/2009 | Shiraishi | H01L 23/49861 257/99 |
| 2009/0075515 | A1* | 3/2009 | Kuwahara | H01L 23/3735 439/487 |
| 2009/0090540 | A1* | 4/2009 | Tullidge | H05K 1/0206 174/252 |
| 2009/0260858 | A1* | 10/2009 | Nakai | H05K 1/0206 174/252 |
| 2009/0301765 | A1 | 12/2009 | Strauss et al. | |
| 2009/0301766 | A1* | 12/2009 | Park | H01L 23/3121 174/255 |
| 2010/0000766 | A1* | 1/2010 | Loiselet | H01L 23/433 174/252 |
| 2010/0055811 | A1* | 3/2010 | Lin | H01L 21/486 438/26 |
| 2010/0065307 | A1 | 3/2010 | Nagase et al. | |
| 2010/0248569 | A1 | 9/2010 | Peng et al. | |
| 2010/0264798 | A1* | 10/2010 | Ruan | F21K 9/00 313/46 |
| 2011/0203839 | A1* | 8/2011 | Iwamoto | H05K 3/4608 174/260 |
| 2011/0311831 | A1* | 12/2011 | Suzuki | H05K 1/0204 428/457 |
| 2012/0181696 | A1 | 7/2012 | Sun | |
| 2012/0241810 | A1* | 9/2012 | Wang | H05K 1/0204 257/99 |
| 2012/0279765 | A1* | 11/2012 | Samejima | B32B 15/08 174/255 |
| 2012/0329183 | A1* | 12/2012 | Wang | H05K 1/0204 438/26 |
| 2013/0149437 | A1* | 6/2013 | Oh | C23C 18/1616 427/97.2 |
| 2014/0126156 | A1* | 5/2014 | Naganuma | H05K 1/0206 361/719 |
| 2014/0133103 | A1* | 5/2014 | Nakamura | H01L 23/3735 361/712 |
| 2014/0144677 | A1* | 5/2014 | Wang | H05K 1/0206 174/252 |
| 2014/0190727 | A1* | 7/2014 | Lee | H05K 1/0204 174/252 |
| 2014/0285992 | A1* | 9/2014 | Yang | G02F 1/133305 361/809 |
| 2017/0263546 | A1* | 9/2017 | Lin | H01L 23/49838 |

FOREIGN PATENT DOCUMENTS

| | | |
|---|---|---|
| DE | 10234995 A1 | 2/2004 |
| DE | 10258090 A1 | 4/2004 |
| DE | 102013204889 A1 | 9/2014 |
| DE | 202014006215 U1 | 8/2015 |
| EP | 2621256 A1 | 7/2013 |
| JP | 2009081342 A | 4/2009 |
| JP | 2012151473 A | 8/2012 |
| KR | 20050087563 A | 8/2005 |
| TW | 536795 B | 6/2003 |
| TW | 201220997 A | 5/2012 |
| TW | 201422075 A | 6/2014 |
| WO | 2005083807 A1 | 9/2005 |
| WO | 2010067731 A1 | 6/2010 |

OTHER PUBLICATIONS

International Search Report for Application No. PCT/CN2011/070051 dated Sep. 15, 2011.
International Written Opinion for Application No. PCT/CN2011/070051 dated Sep. 15, 2011.

* cited by examiner

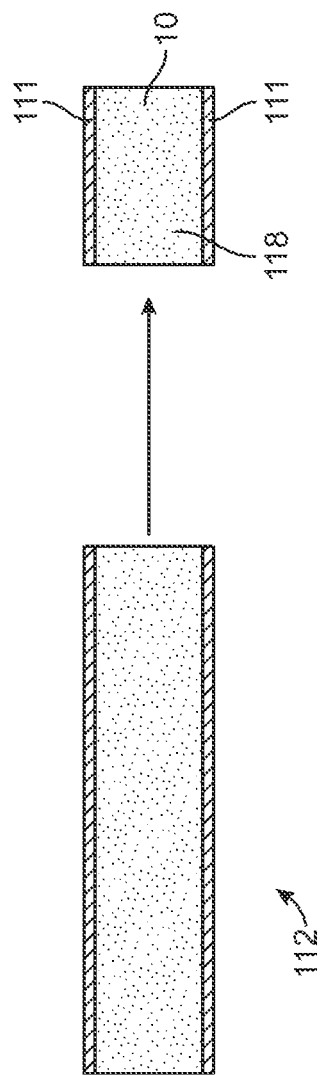

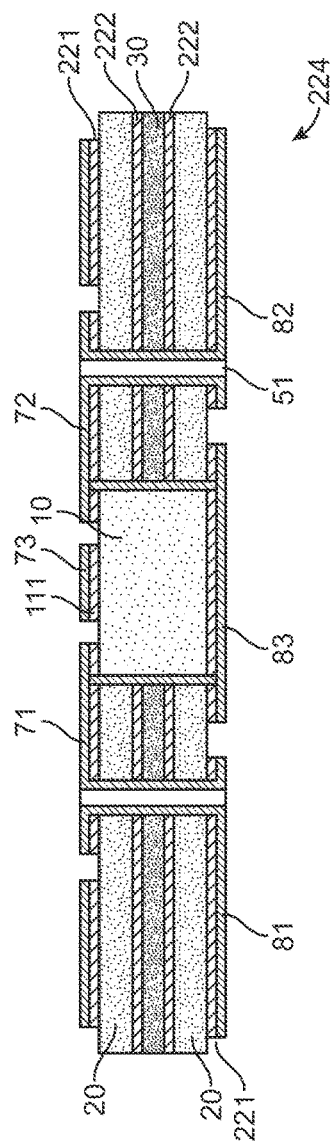
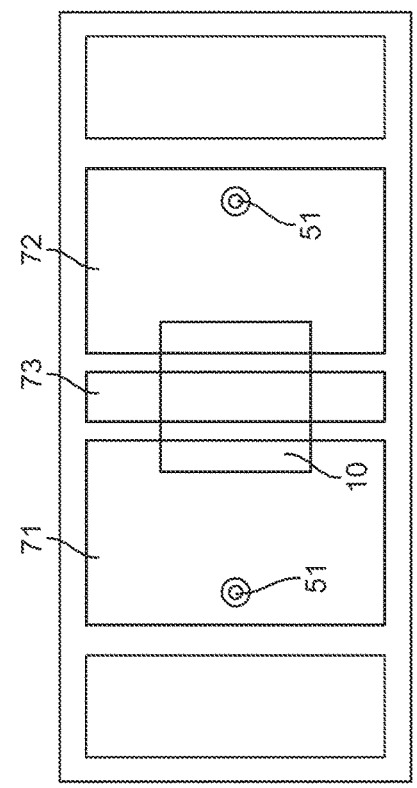
FIG. 7A
FIG. 7B

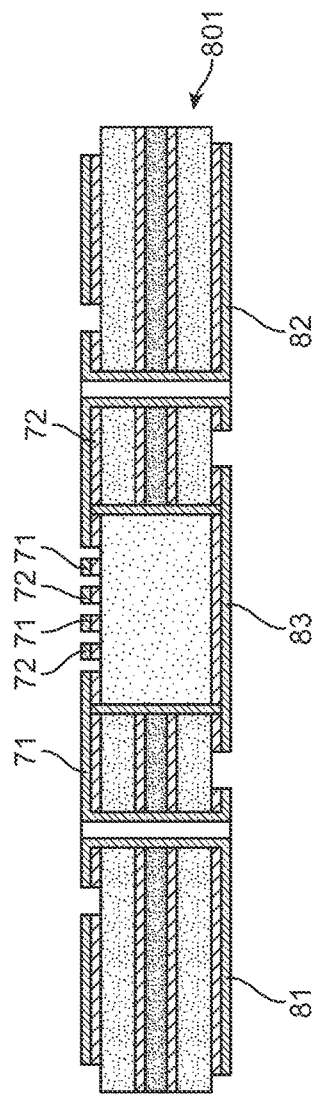
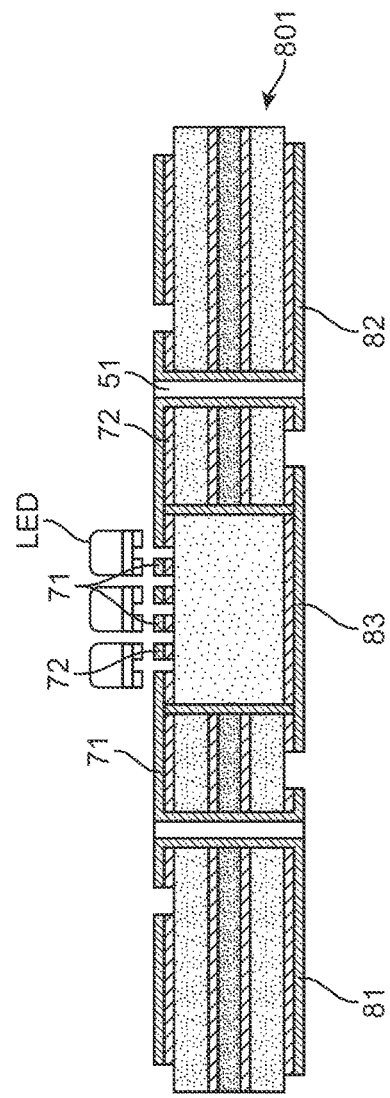
FIG. 8A
FIG. 8B

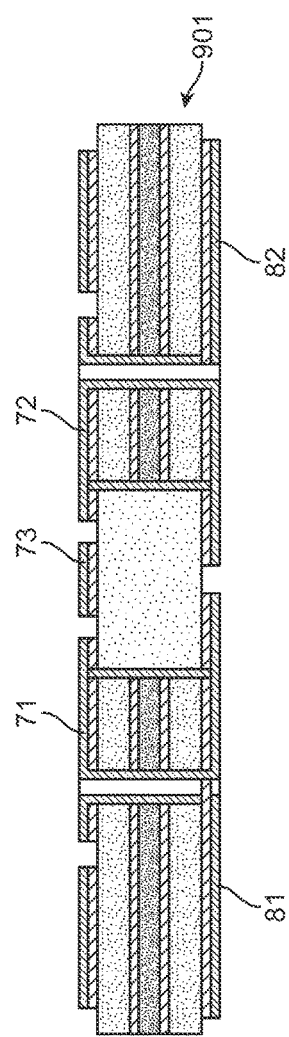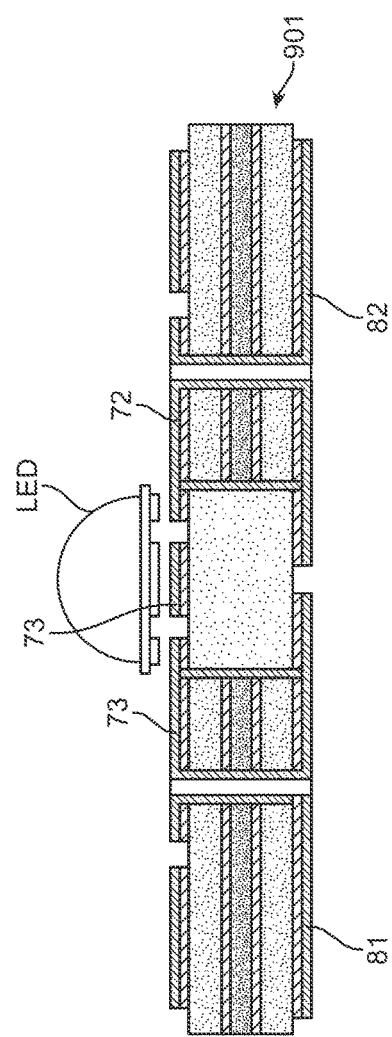
FIG. 9A
FIG. 9B

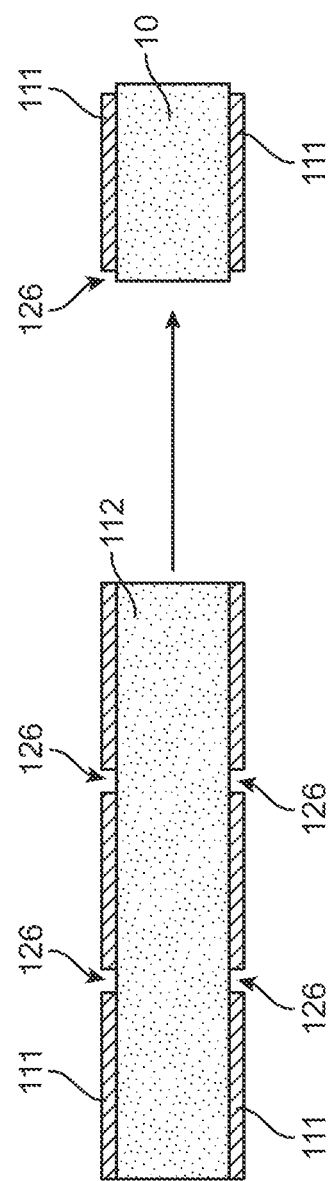

MANUFACTURING METHOD OF PRINTING CIRCUIT BOARD WITH MICRO-RADIATORS

CROSS-REFERENCE TO RELATED APPLICATIONS

The present application is a continuation-in-part of U.S. patent application Ser. No. 13/514,999, filed on Sep. 14, 2012, which application is a national phase entry under 35 U.S.C. § 371 of International Application No. PCT/CN11/70051 filed Jan. 6, 2011, which claims priority from CN 201010604353.4 filed Dec. 24, 2010, all of which are hereby incorporated herein by reference.

BACKGROUND OF THE INVENTION

Printed circuit boards (PCBs) are an important element in the electronics industry. PCBs are used as mechanical support elements for electronic components, and realize electrical connection among the electronic components. In addition, graphics and numbers of the components can be printed on the PCBs, it is convenient for furnishing, checking or maintaining the components. PCBs are used in almost every electronic device, such as an electronic watch, calculator, computer, communication electronics device, military weapon systems, etc.

LED devices are often attached to PCBs and typically release a large quantity of heat during their operation. It is necessary for a PCB coupled to an LED device to have good heat dissipation properties.

CN Application No. 201180037321.3, U.S. Patent Application Publication No. 2002/0180062, and others disclose printed circuit boards having a ceramic radiator. The ceramic radiators described therein can export the heat produced by a heating element but heat expansion coefficient of the radiator is significantly different from that of the resin layer that functions as the insulating carrier of the printed circuit board. Therefore, a need exists for an improved PCB design.

BRIEF SUMMARY OF THE INVENTION

A PCB according to one aspect of the disclosure includes a radiator, a substrate, a plurality of electrode bonding pads formed on the top surface of the PCB, a plurality of terminals on the bottom surface of the PCB and electrically connected to the electrode bonding pads, and a heat dissipater on the bottom surface coupled to the radiator and the substrate.

A flexible PCB can also include a second printed circuit board having a top surface and a bottom surface, a radiator, a substrate, a plurality of electrode bonding pads on the top surface, a plurality of terminals on the bottom surface each electrically connected to at least one of the plurality of electrode bonding pads, and a heat dissipater on the bottom surface coupled to the radiator and the substrate and the PCBs can be linked by a flexible member between the top and bottom surfaces of each of the PCBs. The PCBS may be separated by a distance but remain linked to one another by the flexible member. The substrate may include a semi-cured sheet between a plurality of resin plates.

A method of manufacturing a flexible PCB according to one aspect of the disclosure may include providing a plurality of radiators each having an electrically conductive layer and an electrically insulated core. The method may also include providing a substrate including a plurality of through holes and a flexible member, inserting the plurality of radiators in the plurality of through holes, and heat pressing the substrate and radiators to secure the substrate and radiators to each other. The method may further include depositing an electrically conductive layer on the substrate and radiators and removing a portion of the substrate between the radiators to create a flexible region.

The method could include coupling a resin plate having a plurality of through holes extending therethrough and a plurality of recesses extending partially through the resin plate to a semi-cured sheet having a plurality of through holes and a clearance hole, and to a flexible member together such that the plurality of through holes align and each of the plurality of recesses align with an edge of the clearance hole. Excess resin may be removed from a surface of the flexible PCB. An electrically conductive layer could be formed on a surface of the flexible PCB and etched to form a plurality of electrode bonding pads and a heat conducting pad according to one method of the disclosure. The method could also include forming a second electrically conductive layer on a second surface of the flexible PCB and etching the second electrically conductive layer to form a plurality of terminals and a heat dissipating pattern which covers at least a portion of one of the plurality of radiators and the substrate. An LED may be coupled to the flexible PCB.

One aspect of the disclosure describes a method of manufacturing a PCB including forming a first electrically conductive layer on a surface of an electrically insulated core and etching a region of the first conductive layer to expose the insulated core. The insulated core can then be cut along the etched region to create a radiator which may have a portion of the insulated core remaining exposed after cutting. The method of manufacture can also include providing a substrate having a through hole, inserting the radiator into the through hole, heat pressing the radiator and the substrate, forming a second electrically conductive layer on a surface of the radiator and substrate, and etching the second electrically conductive layer to create a plurality of electrode bonding pads and a heat conducting pad.

The method may also include forming a third electrically conductive layer on a second surface of the radiator and substrate and etching the third conductive layer to form a plurality of terminals and a heat dissipating pattern. The substrate may include a semi-cured sheet and a resin plate having a fourth conductive layer and a fifth conductive layer, the fourth conductive layer having a circuit pattern and providing the substrate may include coupling the fourth conductive layer to the semi-cured conductive sheet such that the circuit pattern is internally contained within the substrate. An LED may be coupled to the plurality of electrode bonding pads.

BRIEF DESCRIPTION OF THE DRAWINGS

A more complete appreciation of the subject matter of the present invention and the various advantages thereof can be realized by reference to the following detailed description, in which reference is made to the accompanying drawings:

FIG. 1A is a cross-sectional view of a radiator in accordance with one embodiment of the current invention.

FIG. 7A is a cross-sectional view of the PCB of FIG. 6 with surface circuits formed on the conductive layers in accordance with one embodiment of the current invention.

FIG. 7B is a top view of the PCB of FIG. 7A.

FIG. 8A is a cross-sectional view of the PCB of FIG. 6 with surface circuits formed on the conductive layers in accordance with another embodiment of the current invention.

FIG. 8B is a cross-sectional view of the PCB of FIG. 8A with LEDs attached thereto.

FIG. 9A is a cross-sectional view of the PCB of FIG. 6 with surface circuits formed on the conductive layers in accordance with yet another embodiment of the current invention.

FIG. 9B is a cross-sectional view of the PCB of FIG. 9B with an LED attached thereto.

FIG. 10 is a cross-sectional view of a radiator in accordance with another embodiment of the current invention.

DETAILED DESCRIPTION

Figure 15:
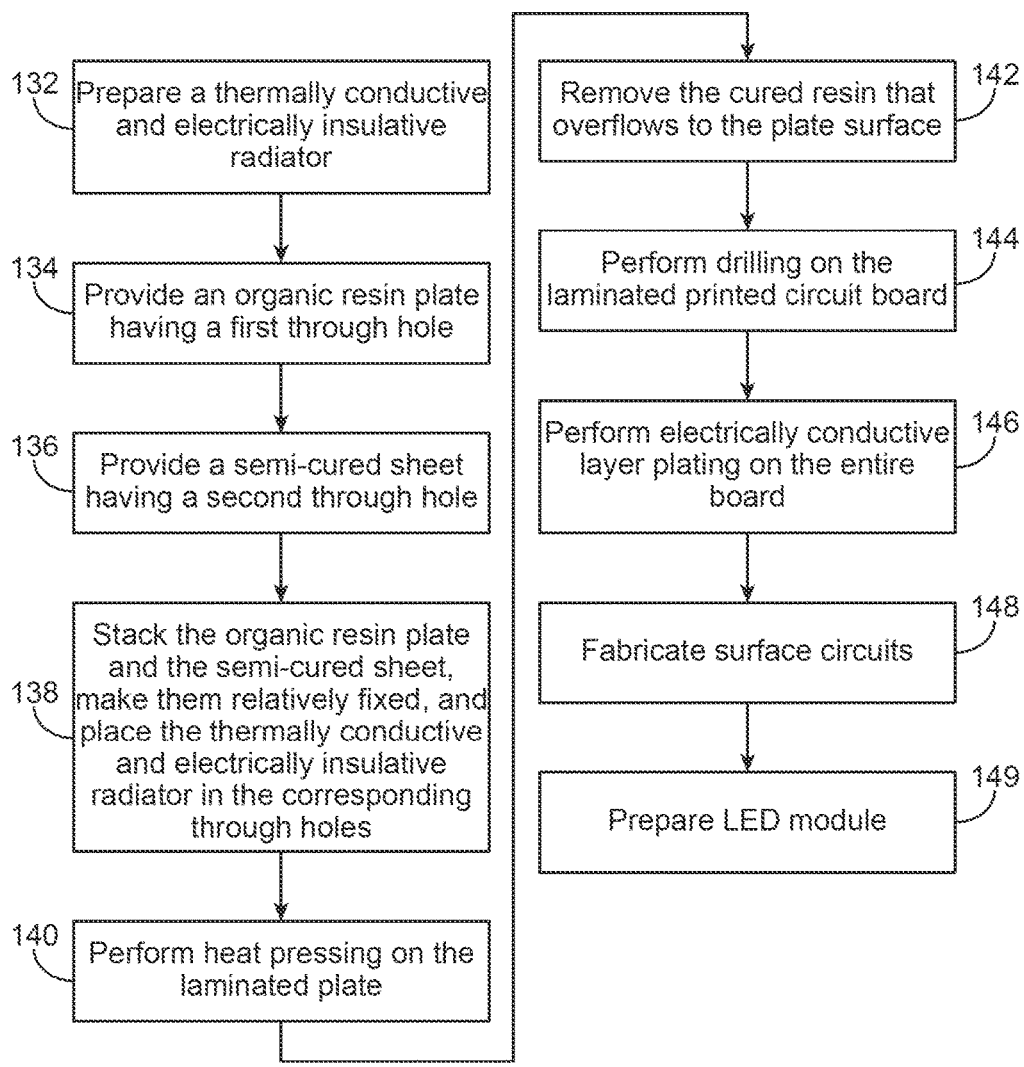
FIG. 15 is flow chart illustrating one method of manufacturing a PCB in accordance with the current invention.

A method of manufacturing a PCB according to one embodiment of the invention includes preparing a thermally conductive and electrically insulative radiator as depicted in step 132 of FIG. 15. The preparation includes coating the radiator 10 with an electrically conductive layer 111 on one or both of the top and bottom surfaces as shown in FIG. 1A. An electrically conductive layer, as used throughout the specification, may be copper, gold, or any other electrically conductive material. The thermally conductive and electrically insulative radiator 10 may include a core 118 made from a ceramic, such as aluminum oxide ceramics, aluminum nitride ceramics, silicon carbide ceramics, etc. In the embodiment shown in FIG. 1A, an aluminum oxide ceramic plate 112 coated with copper on both surfaces is cut by means of mechanical or laser cutting to obtain a thermally conductive and electrically insulative radiator 10 with an electrically conductive layer 111 coated on both the top and bottom surfaces. The conductive layer 111 extends completely across the top and bottom surfaces to the edges thereof which can help reduce thermal stress on the radiator and prevent separation between the radiator and the dielectric layer.

Figure 1B:
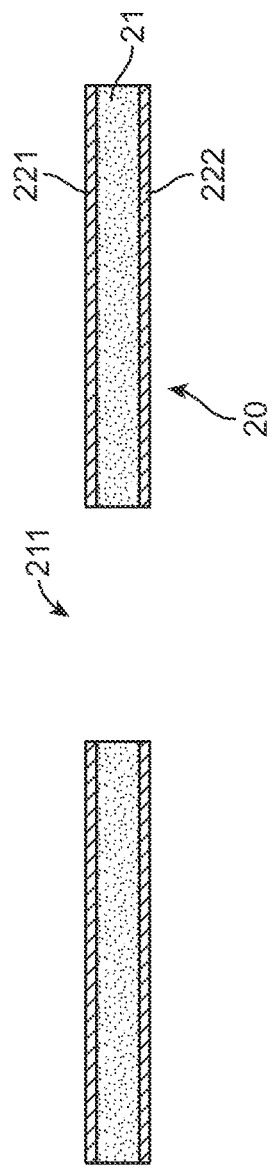
FIG. 1B is a cross-sectional view of a resin plate in accordance with one embodiment of the current invention.

The method of manufacture described in FIG. 15 includes providing an organic resin plate having a first through hole 134. As shown in FIG. 1B, the organic resin plate 20 is coated with an electrically conductive layer 221, 222. The organic resin plate 20 has a first through hole 211 configured to receive the radiator 10. The resin plate 20 can be epoxy, fiber reinforced epoxy, FR4, etc. Although the organic resin plate shown in FIG. 1B is coated with an electrically conductive layer on both sides, it is also possible to have the coating on a single side as desired. In FIG. 1B, a double-sided FR4 copper coated plate 20 is provided, which comprises a dielectric layer 21 with electrically conductive layers 221 and 222. The first through hole 211 is prepared by means of mechanical or laser drilling. The electrically conductive layer 221 is an electrically conductive layer with no circuit pattern processed on its surface. In one embodiment, the electrically conductive layer 221 has a thickness equal to that of the electrically conductive layer 111 which may be about 10 Z. The other electrically conductive layer 222 is an electrically conductive layer with a circuit pattern (not shown) processed thereon according to methods known in the art (e.g. etching).

Figure 1C:
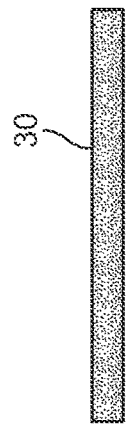
FIG. 1C is a cross-sectional view of a semi-cured sheet in accordance with one embodiment of the current invention.
Figure 7C:
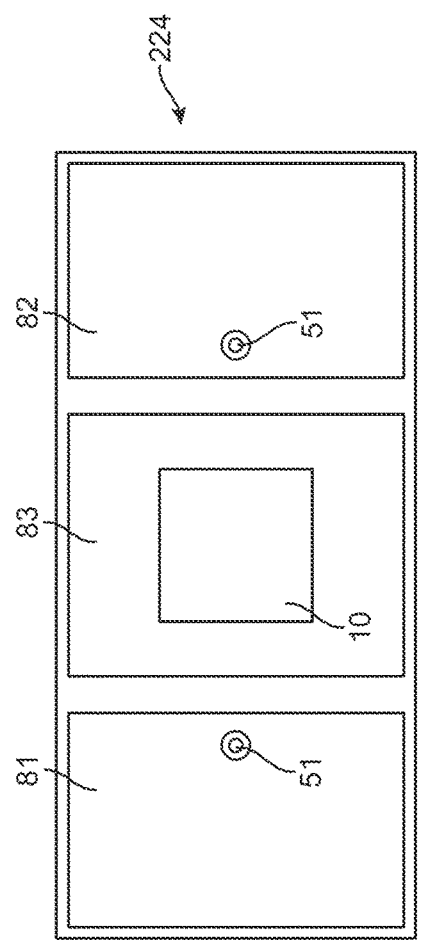
FIG. 7C is a bottom view of the PCB of FIG. 7A.
Figure 7D:
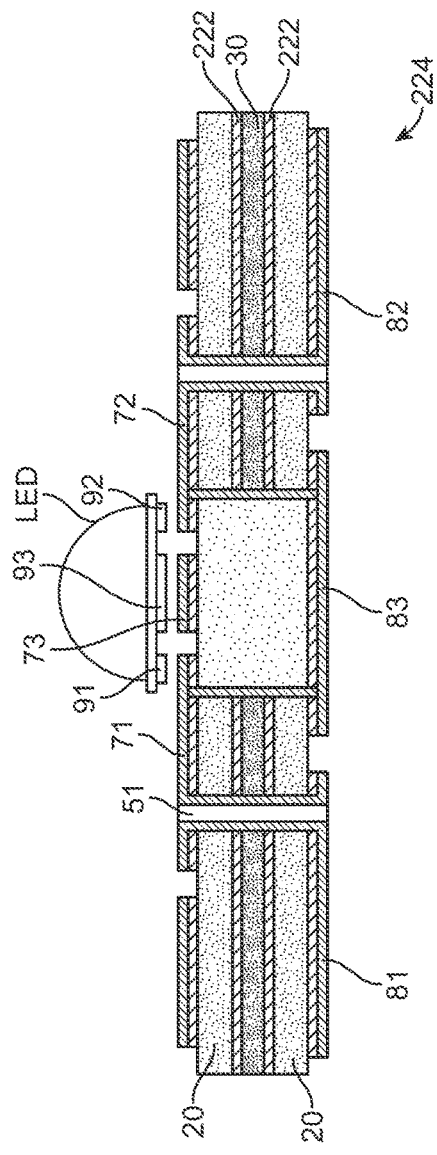
FIG. 7D is a cross-sectional view of the PCB of FIG. 7A with an LED attached thereto.
Figure 7E:
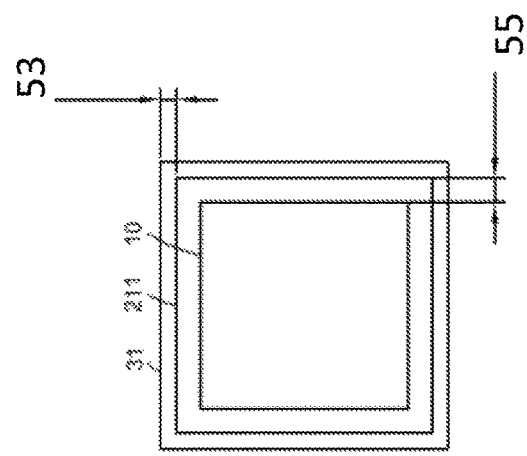
FIG. 7E is a top view of a through hole in the PCB of FIG. 7A.

The method of FIG. 15 includes providing a semi-cured sheet having a second through hole in step 136. The PCB according to one embodiment of the invention includes the semi-cured sheet 30 (e.g. prepeg) having a second through hole 31 as best seen in FIG. 1C. The second through hole 31 desirably has dimensions similar to that of the first through hole 211 in the resin plate 20 to receive the radiator 10. In one embodiment, the second through hole 31 can prepared by means of mechanical or laser drilling on the semi-cured sheet 30. In other embodiments, the semi-cured sheet can be manufactured (in a mold, etc.) as already having the second through hole formed therein. The semi-cured sheet 30 can include epoxy which has not been fully cured. The relationship of the through holes and the radiator is depicted in FIG. 7E. The radiator 10 has a first length and width which may or may not be equal. The first through hole 211 is larger than the radiator by a first offset 55 to allow the radiator to be positioned within the dielectric layer 21. The second through hole 31 is shown as larger than the first through hole by a second offset 53. The first offset distance 55 is preferably between 0.1 and 0.2 mm and more preferably between 0.14 and 0.16 mm. The second offset 53 distance is preferably between 0.05 and 0.15 mm and more preferably between 0.09 and 0.11 mm.

Figure 2:
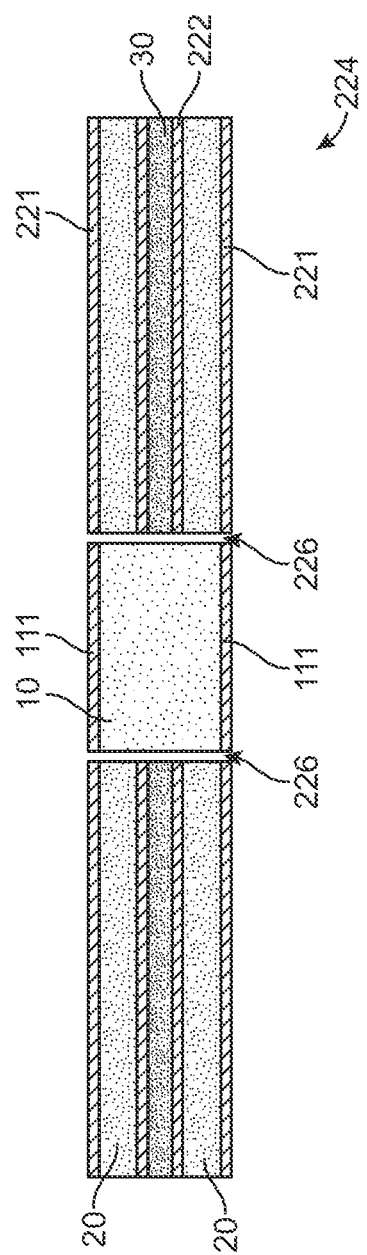
FIG. 2 is a cross-sectional view of a PCB in accordance with one embodiment of the current invention including the radiator of FIG. 1A, the resin plate of FIG. 1B, and the semi-cured sheet of FIG. 1C.

FIG. 15 describes a method of manufacture which includes stacking the resin plate and the semi-cured sheet, making them relatively fixed, and placing the radiator in the corresponding through holes 138. FIG. 2 depicts a resin plate 20 on each side of the semi-cured sheet 30. The first and second through holes 211, 31 are aligned and the resin plates 20 and semi-cured sheet 30 are temporarily or permanently bonded together (via bonding, gluing, welding, clamping, using connectors, etc.). The method further includes placing the radiator 10 inside the through holes to create a laminated PCB 224. As shown in FIG. 2, the electrically conductive layer 222 having the circuit pattern is positioned adjacent the semi-cured sheet 30 and is thus disposed inside the printed circuit board. In other words, all internal circuits of the PCB have been prepared prior to this step.

The method of FIG. 15 includes performing heat pressing on the laminated PCB 224 in step 140. Heat pressing includes applying pressure on opposite surfaces of the laminated PCB 224 while simultaneously heating the laminated PCB 224. The thickness of the laminated PCB 224 decreases under the action of the pressure, such that the surfaces of the electrically conductive layers 111 and 221 are substantially flush or nearly so. It is believed that heating the laminated PCB 224 allows the uncured epoxy in the semi-cured sheet 30 to fill the gap 226 (shown in FIG. 2) between the radiator 10 and the resin plates 20 and flow to the surfaces of the electrically conductive layers 111 and 221. The flowability of prepeg is positively related to its epoxy content. In some embodiments, the epoxy content of the prepeg disposed adjacent the resin plates can be about 60-75 wt %, and more preferably, 65-70 wt %. The relatively high flowability can help the prepeg to substantially or completely fill the gap 226. The radiator 10 and the plates 20 are fixedly connected as shown in FIG. 3 as a result of the heat pressing.

Figure 16:
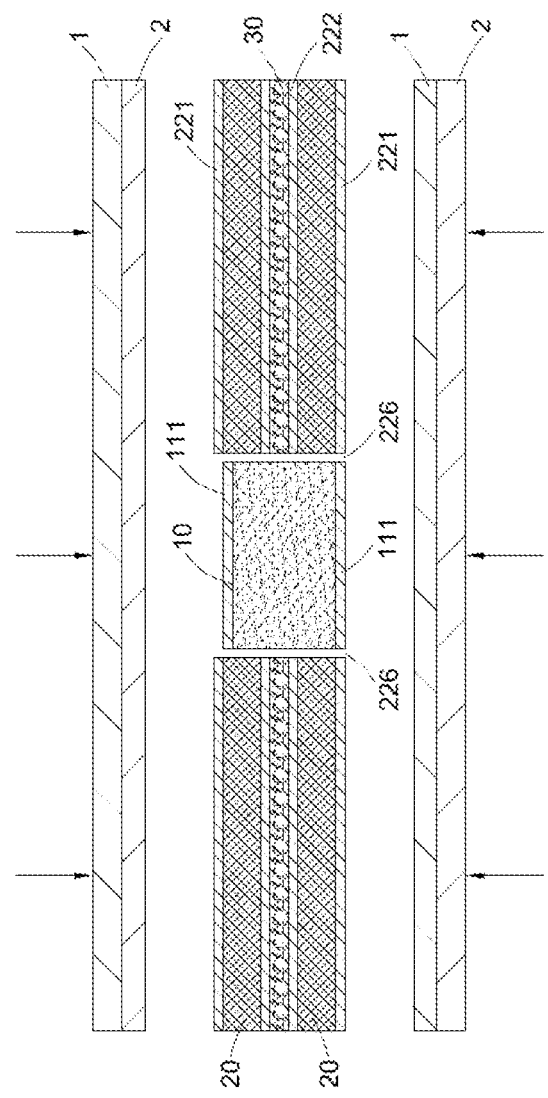
FIG. 16 is a cross-sectional view of the PCB of FIG. 2 between a heat pressing plate in accordance with one embodiment of the current invention.

FIG. 16 illustrates one embodiment of a device which can be used in the heat pressing step. The device includes release film 2 is coupled to a flexible firm layer 1 (e.g. metal, plastic, Copper, Aluminum) having a thickness of about 0.05-0.3 mm. The film 2 and flexible firm layer 1 are disposed on both sides of the laminated PCB 224 with the release film 2 adjacent the PCB. The flexible firm layer 1 can improve the flatness of the laminated PCB 224 during the heat pressing such that the first electrically conductive layer 221 is co-planar with the electrically conductive layer 111 on the surface of the radiator 10 after the heat pressing step as shown in FIG. 2.

Figure 3:
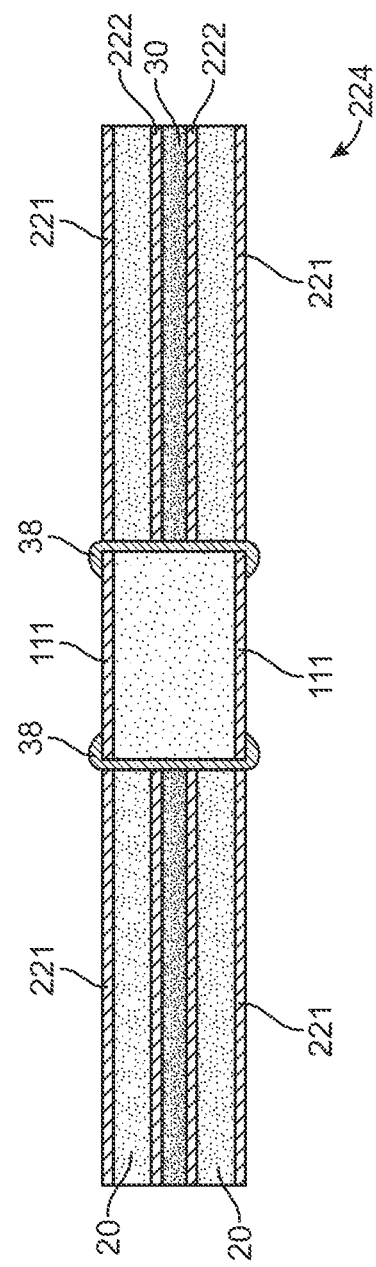
FIG. 3 is a cross-sectional view of the PCB of FIG. 2 with excess resin.
Figure 4:
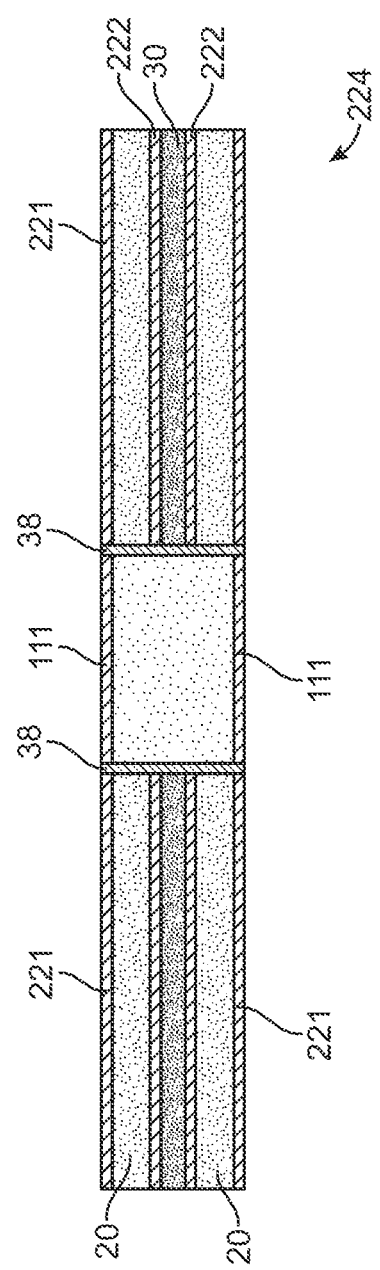
FIG. 4 is a cross-sectional view of the PCB of FIG. 3 with the excess resin removed.

Excess resin 38 may flow to the plate surface during the heating step as shown in FIG. 3. Therefore, the method includes removing the cured resin 38 that overflows to the plate surface as described in step 142 of FIG. 15. In one embodiment, this can be achieved by grinding the cured resin 38 which is typically performed on the electrically conductive layers 111 and 221 at the same time. The grinding process can also help ensure that the surfaces of the cured resin 38 and the electrically conductive layers 111 and 221 are substantially flush, or nearly so, as shown in FIG. 4. In other embodiments, the cured resin could be removed by other methods (e.g. chemically).

Figure 5:
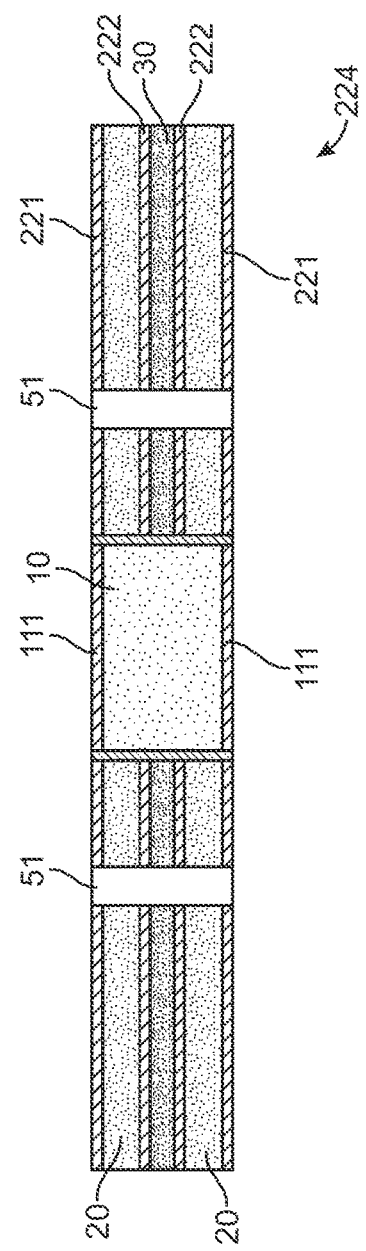
FIG. 5 is a cross-sectional view of the PCB of FIG. 4 with through holes formed therein.

Through holes 51 are drilled through the laminated PCB 224 as part of the manufacturing process as described in step 144 of FIG. 15. The through holes 51 shown in FIG. 5 provide a path through which an electric connection can be established among all electrically conductive layers, as explained below.

Figure 6:
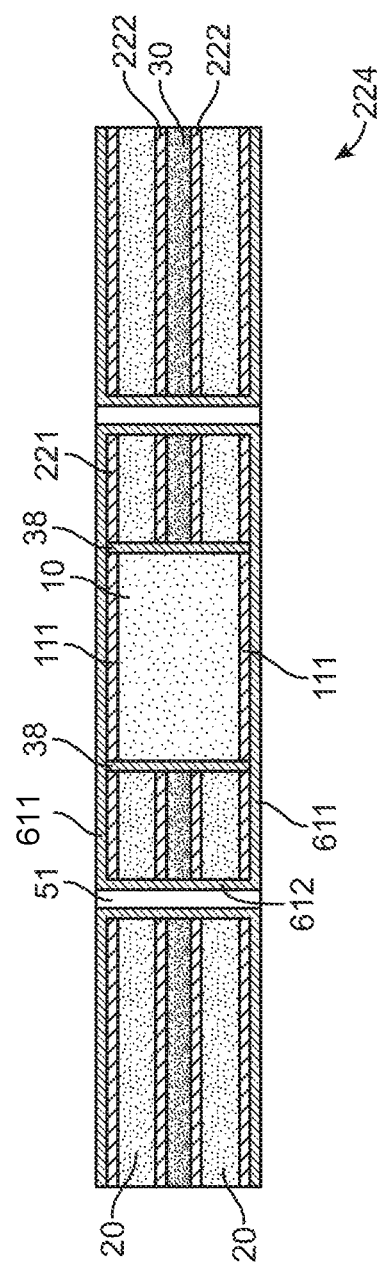
FIG. 6 is a cross-sectional view of the PCB of FIG. 5 with a conductive layer formed thereon.

FIG. 15 describes a method which includes plating the board with an electrically conductive layer as shown in FIG. 6. The electrically conductive layer 611 is formed on the surfaces of the cured resin 38 as well as the electrically conductive layers 111 and 221. An electrically conductive layer 612 is also formed on the internal wall of the through holes 51. In one embodiment, the electrically conductive layers 611, 612 can be initially formed by chemical disposition of a base layer of copper. Electroplating can then be used to deposit additional copper onto the base layer. Of course, other conductive materials can be used in place of copper as previously discussed. The present invention is not intended to be limited to this process for creating the electrically conductive layer and any method of creating an electrically conductive layer known in the art may be used.

Surface circuits are fabricated in step 148 of FIG. 15. The circuits are fabricated on the laminated PCB 224 as shown in FIGS. 7A-C. Typically, a pattern etching method (pattern processing) is used for fabricating surface circuits, which forms corresponding electrically conductive patterns on the top and bottom surfaces of the printed circuit board 224. As shown in FIGS. 7A-C, pattern processing is performed on the electrically conductive layers 111, 221 and 611 on the top surface of the PCB to obtain a positive electrode bonding pad 71, a negative electrode bonding pad 72, and a heat conducting bonding pad 73. The bonding pads 71, 72, 73 all extend through the electrically conductive layers 221 and 611 to the surfaces of the radiator 10 and the dielectric layer 21 of the resin plate 20. Pattern processing is also performed on the electrically conductive layers on the bottom surface of the PCB to obtain a first terminal 81, a second terminal 82 and a heat dissipating pattern 83. The etching separating the heat dissipating pattern 83 from the first and second terminals 81, 82 extends to the surfaces of the radiator 10 and the dielectric layer 21.

The method includes coupling an LED to the PCB in step 149 of FIG. 15. As shown in FIG. 7D, the LED device comprises a positive electrode 91, a negative electrode 92, and a heat sink 93. The positive electrode 91, negative electrode 92, and heat sink 93 are coupled (e.g. via welding, epoxy) to the positive electrode bonding pad 71, negative electrode bonding pad 72, and the heat conducting bonding pad 73, respectively, thereby creating the LED module. Heat generated by the LED device can be dissipated through the heat conducting bonding pad 73, the radiator 10 and the heat dissipating pattern 83.

The method may further include coupling an LED drive circuit or control circuit element (not shown) to the bottom surface or top surface of the PCB. Such circuits may include driver, dimmer, voltage control, current control, color control, temperature protection circuits, etc. The method may also include the corresponding steps of arranging or forming such circuits on the PCB.

FIG. 8A illustrates another embodiment of a PCB 801. Some aspects of PCB 801 and its methods of manufacture are similar to that depicted in FIGS. 1-7D, and only the differences between the this embodiment and that previously described are discussed. The PCB 801 of FIGS. 8A-8B is depicted having a different electrically conductive pattern on the top surface compared to PCB 224. The pattern processing can be performed as previously described but the heat conducting bonding pad is omitted. Instead, multiple positive electrode bonding pads 71 and negative electrode bonding pads 72 are created. At least one of the positive electrode bonding pads 71 and the negative electrode bonding pads 72 extends to the surfaces of the radiator 10 and the dielectric layer 21. The positive electrodes and the negative electrodes of the LED devices may be coupled to the positive electrode bonding pads 71 and the negative electrode bonding pads 72, respectively, thereby obtaining the LED module. having multiple LEDs.

In other words, PCB 224 (FIG. 7D) is applicable for a LED device having three pins/electrodes, and PCB 801 (FIG. 8B) is applicable for a LED device having two pins/electrodes (e.g. a flip-chip LED chip).

In addition, the PCB in some or all embodiments of the present application are particularly applicable for LED devices mounted or encapsulated with a silicon substrate/chip. This is because silicon and ceramics have relatively similar heat expansion coefficients, and therefore, can avoid or reduce various structural and heat dissipation drawbacks as a result of the mismatch in heat expansion coefficients between an LED device and a printed circuit board. Thus, the product created according to the methods described herein has increased stability compared to previously known methods.

Another embodiment of a PCB is shown in FIGS. 9A-9B. The electrically conductive pattern on the bottom surface of PCB 901 omits the heat dissipating pattern previously described. Instead, pattern processing is performed on the electrically conductive layers 111, 221 and 611 on the bottom surface of the PCB to obtain a first terminal 81 and a second terminal 82, wherein the first terminal 81 and the second terminal 82 extend to the surfaces of the radiator 10 and the dielectric layer 21.

The conductive layer 111 of the radiator 10 can be etched prior to cutting the plate 112 as shown in FIG. 10. The etching forms a clearance 126 between the edge of the radiator and the electrically conductive layer 111. Performing the etching step during preparation of the radiator also eliminates the formation of any burrs from the electrically conductive layer associated with a mechanical cutting process, thereby improving production efficiency.

Figure 11:
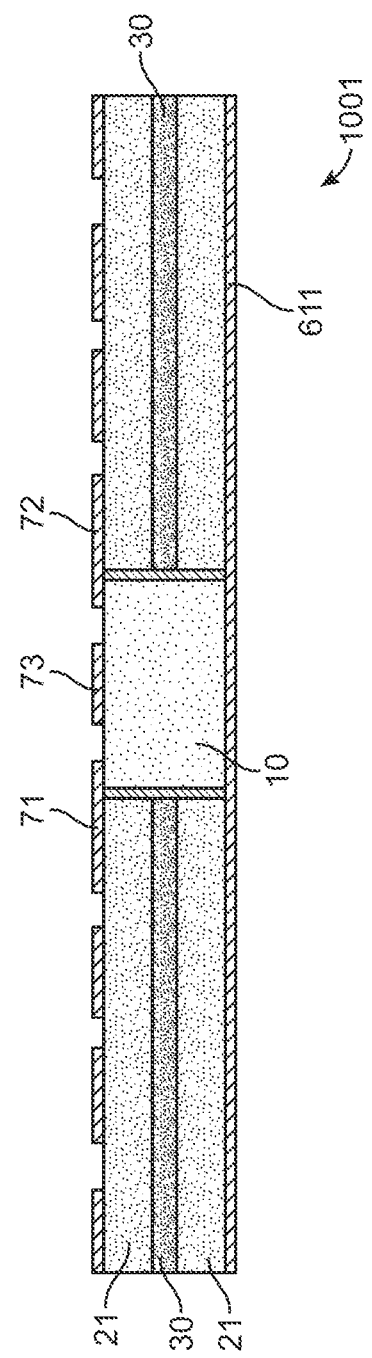
FIG. 11 is a cross-sectional view of a PCB in accordance with another embodiment of the current invention.

FIG. 11 illustrates a PCB 1001 having a radiator 10 and resin plate which are each formed without the electrically conductive layers 111, 221, 222 as described in previous embodiments. Instead, the dielectric layer 21 of the resin plate is coupled directly to the semi-cured sheet 30. The electrically conductive layer 611 is formed on the outer surface of the dielectric layers in accordance with the method previously described.

Figure 12:
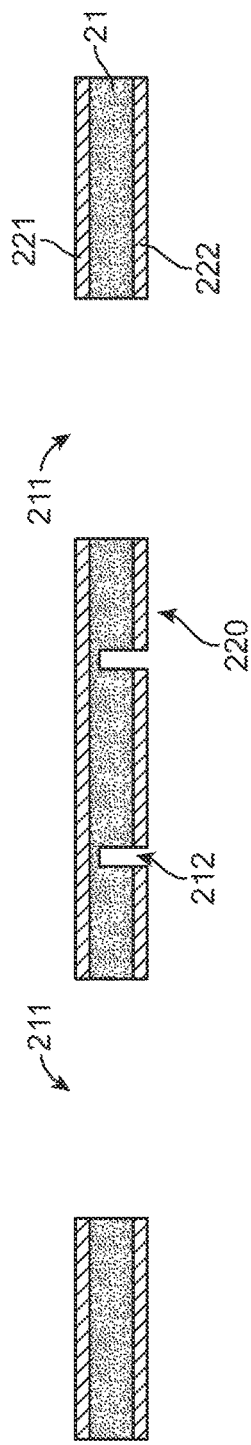
FIG. 12 is a cross-sectional view of a resin plate in accordance with yet another embodiment of the current invention.
Figure 13:
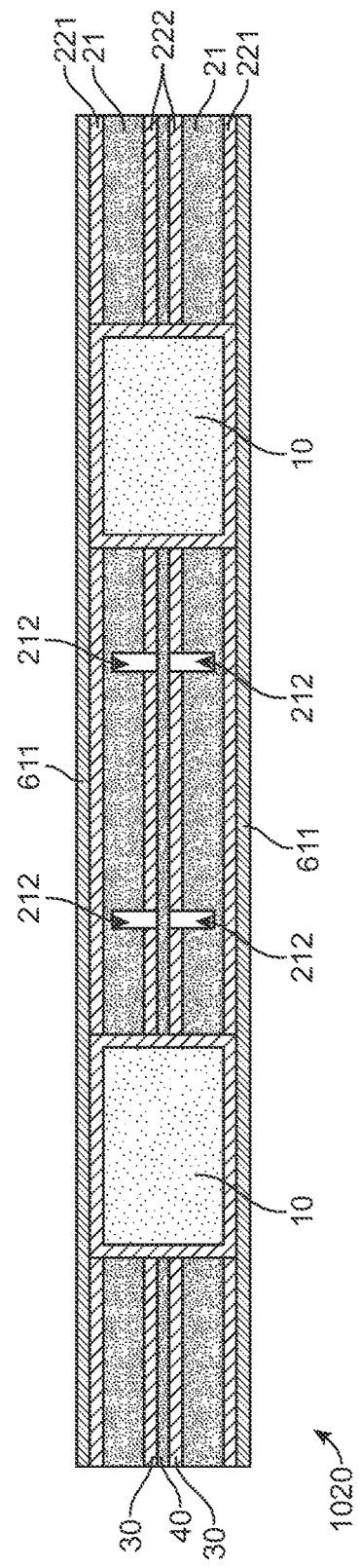
FIG. 13 is a cross-sectional view of a PCB in accordance with another embodiment of the current invention.
Figure 14:
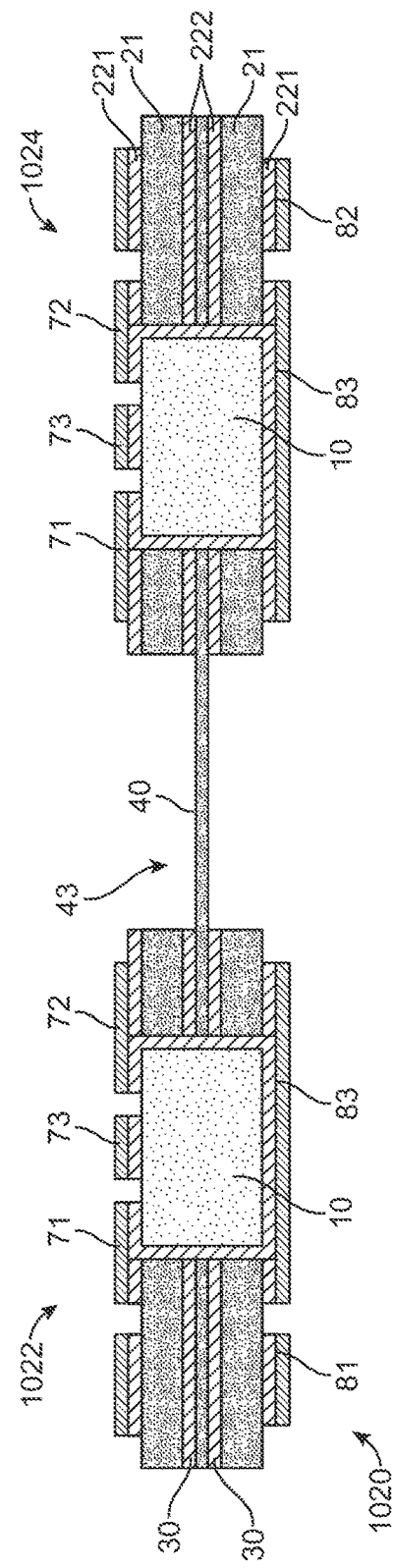
FIG. 14 is a cross-sectional view of the PCB of FIG. 14 with portions of the resin plate removed.

Another embodiment of a PCB is shown in FIGS. 12-14 that combines both flexible and rigid parts. As shown in FIG. 13, the PCB 1020 includes a flexible circuit board 40 positioned between first and second semi-cured sheets 30. The flexible circuit board 40 has a third through hole which aligns with the first and second through holes in the resin plate and semi-cured sheet, respectively. The surface of the flexible circuit board 40 corresponding to the flexible portion 43 of the PCB 1020 is provided with a protective film (not shown).

Recesses 212 are formed in the resin plate 220 which form the boundaries of the flexible region of the PCB 1020 (e.g. by mechanical or laser cutting) as shown in FIG. 12. The recesses are typically formed during manufacture of the resin plate but could also be cut after the PCB is assembled. The resin plate 220 also includes a plurality of first through holes 211 to accommodate a plurality of radiators 10. A clearance hole in the semi-cured sheet 30 corresponding to the desired flexible portion 43 of the PCB 1020 is created prior to assembling the PCB.

The area corresponding to the desired flexible portion between the clearance holes in the semi cured sheet 30 is larger than the final flexible portion 43 to prevent or reduce epoxy flowing to the flexible portion 43. The prepeg adjacent the flexible circuit board can have less flowability than that of the prepeg adjacent the resin plates. For example, the epoxy content of the prepeg adjacent the flexible circuit board can be about 40-55 wt %, and more preferably, about 45-50 wt %. The relatively low flowability helps the prepeg to fill the gap 226 with reduced, or no prepeg flowing to the surface of the flexible portion 43.

As shown in FIG. 14, the part of the rigid PCB corresponding to the flexible portion 43 is removed by means of mechanical or laser cutting. The resulting PCB 1020 has a first rigid portion 1022 and a second rigid portion 1024 with a flexible portion 43 separating the two. The first and second rigid portions 1022, 1024 a connected to one another by the flexible circuit board 40. The flexible PCB 1020 can have surface circuits formed thereon as previously described and an LED attached thereto.

Figure 17:
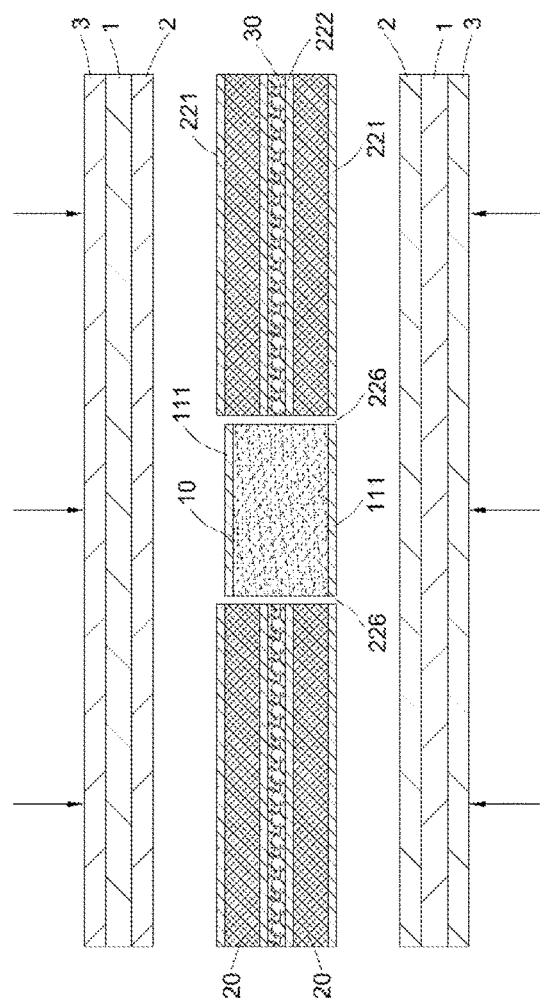
FIG. 17 is a cross-sectional view of the PCB of FIG. 2 between of a heat pressing plate in accordance with another embodiment of the current invention.

Another embodiment of a device which can be used in during the heat pressing step is illustrated in FIG. 17. In this embodiment, an elastomeric material layer 3 is further disposed at the outside of rigid layer 1. The elastomeric layer 3 may be a silicone rubber or similar material.

Another embodiment of the PCB may include one or more layers of flexible PCB and one or more layers of rigid PCB. Different prepegs can be used in such an embodiment. For example, prepeg adjacent the flexible PCB can have a lower flowability than that of the prepeg disposed adjacent the organic resin plates.

Although the invention herein has been described with reference to particular embodiments, it is to be understood that these embodiments are merely illustrative of the principles and applications of the present invention. It is therefore to be understood that numerous modifications may be made to the illustrative embodiments and that other arrangements may be devised without departing from the spirit and scope of the present invention as defined by the appended claims.

The invention claimed is:

1. An object comprising a printed circuit board having a top surface and a bottom surface, the printed circuit board comprising:
    a radiator having an electrically insulated core and first electrically conductive layers formed on the top and bottom surfaces of the electrically insulated core;
    a substrate having second electrically conductive layers formed on the top and bottom surfaces thereof, the second electrically conductive layer being separated from the first electrically conductive layer, wherein the first electrically conductive layer formed on the top surface of the electrically insulated core includes at least two portions separated from one another, and wherein the second electrically conductive layer formed on the top surface of the substrate includes at least two portions separated from one another;
    a plurality of electrode bonding pads on the top surface of the printed circuit board; wherein the electrode bonding pads comprises:
        one third electrically conductive layer directly contacting a surface of one portion of the second electrically conductive layer on the top surface of the substrate and extending from the contacted surface of the one portion of the second electrically conductive layer to a surface of one portion of the first electrically conductive layer on the top surface of the electrically insulated core; and
        another separate third electrically conductive layer directly contacting a surface of another portion of the second electrically conductive layer on the top surface of the substrate and extending from the contacted surface of the other portion of the second electrically conductive layer to a surface of another portion of the first electrically conductive layer on the top surface of the electrically insulated core; and
    a fourth electrically conductive layer on the bottom surface of the printed circuit board, wherein the fourth electrically conductive layer extends from a surface of the second electrically conductive layer on the bottom surface of the substrate to a surface of the first electrically conductive layer on the bottom surface of the electrically insulated core.

2. The object of claim 1, further comprising:
a second printed circuit board having a top surface and a bottom surface, a radiator, a substrate, a plurality of electrode bonding pads on the top surface, a plurality of terminals on the bottom surface each electrically connected to at least one of the plurality of electrode bonding pads, and a heat dissipater on the bottom surface coupled to the radiator and the substrate; and
a flexible member between the top and bottom surfaces of each of the printed circuit boards, the flexible member linking the printed circuit boards.

3. The object of claim 2, wherein the printed circuit boards are separated from each other by a distance and linked by the flexible member.

4. The object of claim 1, wherein the substrate comprises a semi-cured sheet between a plurality of resin plates.

5. The object of claim 1, further comprising an LED coupled to the plurality of electrode bonding pads.

6. The object of claim 1, comprising a plurality of terminals on the bottom surface, each electrically connected to at least one of the plurality of electrode bonding pads.

7. The object of claim 1, comprising a heat dissipater on the bottom surface coupled to the radiator and the substrate.

8. A method of manufacturing a printed circuit board comprising:
forming first electrically conductive layers on the top and bottom surfaces of an electrically insulated core;
cutting the electrically insulated core, thereby creating a radiator;
providing a substrate having a through hole and second electrically conductive layers formed on the top and bottom surfaces thereof;
inserting the radiator into the through hole;
heat pressing the radiator and substrate;
forming a plurality of third electrically conductive layers on the top surface of the printed circuit board and a fourth electrically conductive layer on the bottom surface of the printed circuit board, wherein the plurality of third electrically conductive layers comprises:
one third electrically conductive layer directly contacting a surface of one portion of the second electrically conductive layer on the top surface of the substrate and extending from the contacted surface of the one portion of the second electrically conductive layer to a surface of one portion of the first electrically conductive layer on the top surface of the electrically insulated core, and
another separate third electrically conductive layer directly contacting a surface of another portion of the second electrically conductive layer on the top surface of the substrate and extending from the contacted surface of the other portion of the second electrically conductive layer to a surface of another portion of the first electrically conductive layer on the top surface of the electrically insulated core; and
wherein the fourth electrically conductive layer extends from a surface of the second electrically conductive layer on the bottom surface of the substrate to a surface of the first electrically conductive layer on the bottom surface of the electrically insulated core; and
creating a plurality of electrode bonding pads on the top surface of the printed circuit board.

9. The method of claim 8, wherein etching a region of the first electrically conductive layer and exposing the electrically insulated core before cutting the electrically insulated core along the etched portion, and a portion of the surface of the electrically insulated core remains exposed after cutting the core.

10. The method of claim 8, further comprising creating a heat conducting bonding pad on the top surface of the printed circuit board.

11. The method of claim 8, further comprising coupling an LED to the plurality of electrode bonding pads.

12. The method of claim 8, further comprising creating a plurality of terminals on the bottom surface of the printed circuit board.

13. The method of claim 8, further comprising forming a heat dissipating pattern on the bottom surface of the printed circuit board.

14. The method of claim 8, wherein the substrate comprises a semi-cured sheet and a resin plate having a fifth conductive layer, the fifth conductive layer having a circuit pattern and providing the substrate comprises:
coupling the fifth conductive layer to the semi-cured sheet such that the circuit pattern is internally contained within the substrate.

* * * * *